(12) United States Patent
Hsia et al.

(10) Patent No.: US 7,009,887 B1
(45) Date of Patent: Mar. 7, 2006

(54) METHOD OF DETERMINING VOLTAGE COMPENSATION FOR FLASH MEMORY DEVICES

(75) Inventors: Ed Hsia, Saratoga, CA (US); Darlene Hamilton, San Jose, CA (US); Alykhan Madhani, Santa Clara, CA (US); Kenneth Yu, San Francisco, CA (US)

(73) Assignee: FASL LLC, Sunnyvale, CA (US)

( * ) Notice: Subject to any disclaimer, the term of this patent is extended or adjusted under 35 U.S.C. 154(b) by 0 days.

(21) Appl. No.: 10/860,450

(22) Filed: Jun. 3, 2004

(51) Int. Cl.
*G11C 16/04* (2006.01)

(52) U.S. Cl. .......................... 365/185.28; 365/185.03; 365/185.19; 365/185.24

(58) Field of Classification Search ................ None
See application file for complete search history.

(56) References Cited

U.S. PATENT DOCUMENTS

| | | | | |
|---|---|---|---|---|
| 5,905,674 A | * | 5/1999 | Choi | ...................... 365/185.1 |
| 6,011,715 A | * | 1/2000 | Pasotti et al. | .......... 365/185.03 |
| 6,104,640 A | * | 8/2000 | Banks | ................... 365/189.01 |
| 6,327,183 B1 | * | 12/2001 | Pawletko et al. | ...... 365/185.18 |
| 6,438,031 B1 | * | 8/2002 | Fastow | .................. 365/185.18 |
| 6,686,632 B1 | | 2/2004 | Ogura et al. | |
| 6,690,058 B1 | | 2/2004 | Wu | |
| 6,714,448 B1 | * | 3/2004 | Manea | .................. 365/185.03 |
| 6,768,165 B1 | * | 7/2004 | Eitan | .......................... 257/324 |

* cited by examiner

*Primary Examiner*—Son Mai
(74) *Attorney, Agent, or Firm*—Eschweiler & Associates, LLC

(57) ABSTRACT

The present invention determines or identifies programming variations for different groups within an array or memory device that properly program memory cells within the respective groups. Then, during programming operations for a given memory cell, programming voltages are applied according to the determined or identified programming variations for the group to which the given memory cell belongs. These adjusted programming variations facilitate successful programming of the particular memory cell.

12 Claims, 7 Drawing Sheets

METHOD OF DETERMINING VOLTAGE COMPENSATION FOR FLASH MEMORY DEVICES

FIELD OF INVENTION

The present invention relates generally to memory devices and the like, and in particular to determining and utilizing voltage compensation for programming of flash memory devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling, however other mechanisms of pro-gramming and/or erasing can be employed. As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer.

Individual memory cells are organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The memory cell generally has a source, a drain, and a channel formed there between, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash memory cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by a suitable mechanism, such as hot electron injection. Programming with hot hole injection involves applying a relatively high voltage to the control gate and connecting the source to ground and the drain to a predetermined potential above the source. When a resulting electric field is high enough, electrons collect enough energy to be injected from the source onto the control gate. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. A source read voltage is applied at the source and a drain read voltage is applied at the drain. The drain read voltage is greater than the source read voltage. A read gate voltage is then applied to the gate (e.g., the wordline) of the memory cell transistor that is greater than the drain read voltage in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

Another type of flash memory is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of flash memory cells can be sensitive. Programming of dual bit memory cells can be even more sensitive because the programming involves applying program voltages to the control gate, selecting bitline connections according to which bit is being programmed, and applying program voltages to the acting source and drain. Conditions, such as path resistance, can alter applied program voltages to values that are outside acceptable ranges for the dual bit memory cells. Such programming failures can result in problems including loss of time as a result of re-programming operations, loss of data, and the like.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention determines or identifies programming variations for different groups of memory cells within an array or memory device that adequately program memory cells within the respective groups. Then, during programming operations for a given memory cell, programming voltages are applied according to the determined or identified programming variations for the group to which the given memory cell belongs. These adjusted programming variations result in relatively better programming, in terms of successful programs, data integrity, and the like, than conventional programming methods that employ a single set of programming voltages for an array or device. Additionally, the adjusted programming variations yield a relatively more uniform threshold voltage distribution. As a result, faster erase operations can be performed, which provides improved endurance characteristics and reliability.

For a given dual bit flash memory device, a portion of memory cells of the device are characterized to identify programming variations or adjustments. Subsequently, the memory cells are segmented into groups according to identified programming variations and, optionally, other properties such as location on the device. During programming of a particular memory cell, an associated group of which the particular cell is a member of is identified and programming voltages are obtained from the associated group. The memory cell is programmed with the obtained programming voltages with improved programming results, such as data integrity, programming success rate, and the like, as compared with conventional programming methods that treat all memory cells of a device or array identically during programming.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
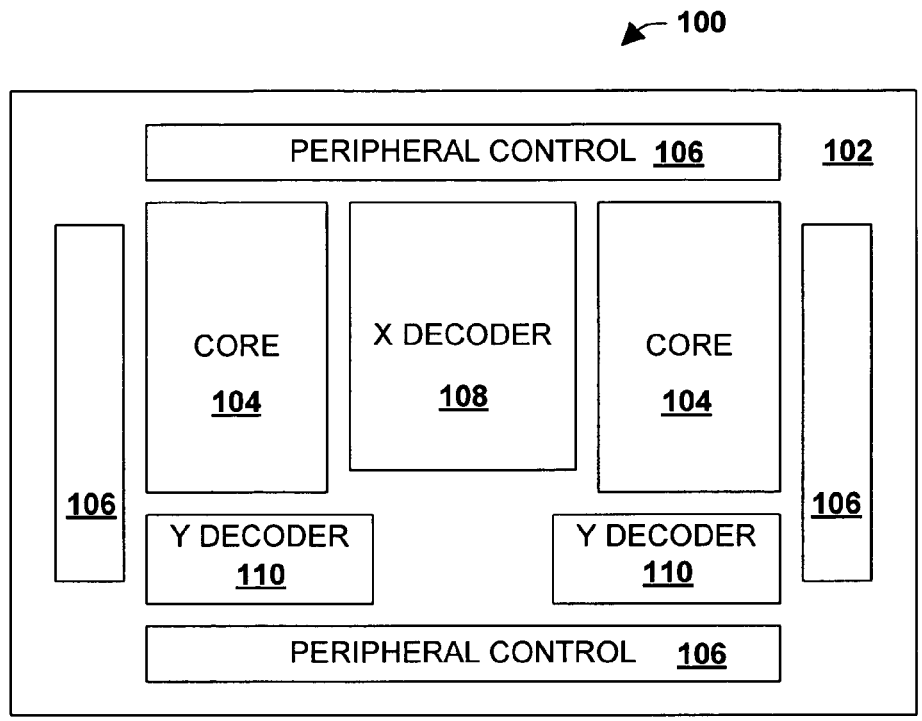
FIG. 1 is a top view of a dual bit flash memory device in accordance with an aspect of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One trend in flash memory devices, particularly dual bit flash memory devices, is to increase array sizes larger and larger and to ever increasing higher densities. As a result, the amount of resistance along conductive lines in the array from one end of an array to another also increases. Accordingly, "ideal" programming conditions, those conditions which result in programming of memory cells substantially all the time, for one group or sector of an array can vary for another group or sector.

The present invention determines or identifies programming variations for different groups within an array or memory device that adequately program memory cells within the respective groups. Then, during programming operations for a given memory cell, programming voltages are applied according to the determined or identified programming variations for the group to which the given memory cell belongs.

Referring initially to FIG. 1, a top view of an exemplary dual bit flash memory 100 in accordance with an aspect of the present invention is illustrated. The memory 100 generally includes a semiconductor substrate 102 in which one or more high-density core regions 104 and one or more lower-density peripheral portions are formed. The high-density density core regions typically include one or more M by N arrays 104 of individually addressable, substantially identical dual bit flash memory cells. The lower-density peripheral portions on the other hand typically include peripheral control circuitry 106. The lower-density peripheral portions also include programming circuitry for selectively addressing the individual memory cells. The programming circuitry is represented in part by and includes one or more x-decoders 108 and one or more y-decoders 110 that cooperate with the peripheral control circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
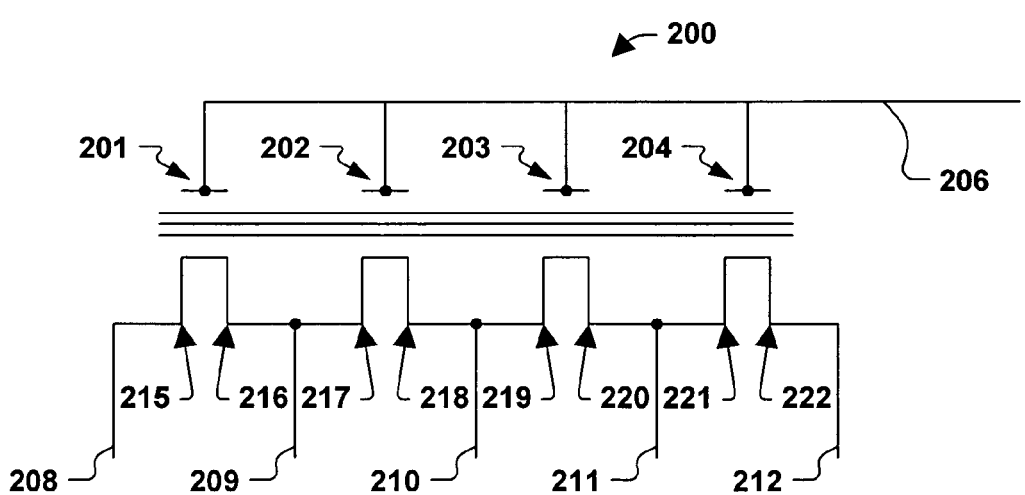
FIG. 2 is a schematic illustration of a portion of a memory core such as may include at least part of one of the cores depicted in FIG. 1 in a virtual ground type configuration in accordance with an aspect of the present invention.

Turning to FIG. 2, a schematic illustration is presented of a portion 200 of an exemplary memory core such as may include at least part of one of the M by N array cores 104 depicted in FIG. 1 in accordance with an aspect of the present invention. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of programmed, read, and/or erased at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Programming of the bit at location 215 is attained through connection of the drain to the bitline 209 and the source to the bitline 208 and programming of the bit at location 216 is attained through connection of the drain to the bitline 208 and the source to the bitline 209. It will be appreciated that although adjacent memory cells share common bitlines, the adjacent memory cells do not interfere with each other because the memory cells are typically read and programmed one at a time and in such instances only one memory cell is active at a time while reading or programming.

Figure 3:
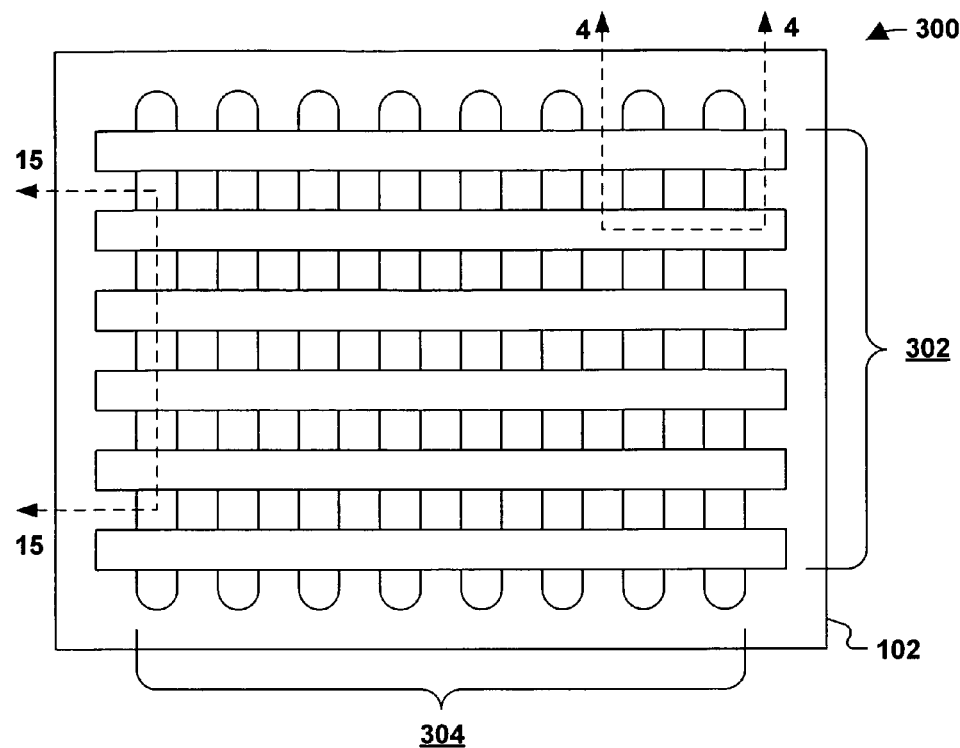
FIG. 3 is a top view of at least a portion of a memory core, such as may include at least part of one of the cores depicted in FIG. 1 in accordance with an aspect of the present invention.

Referring now to FIG. 3, a top view is presented of at least a portion 300 of a memory core, such as may include at least part of one of the M by N array cores 104 depicted in FIG. 1 in accordance with an aspect of the present invention. The memory 300 is formed upon the semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry. The x-decoders 108 and y-decoders 110, depicted in FIG. 1, pass program gate and drain voltages to carry out programming functions to the correct row/column core cell.

Figure 4:
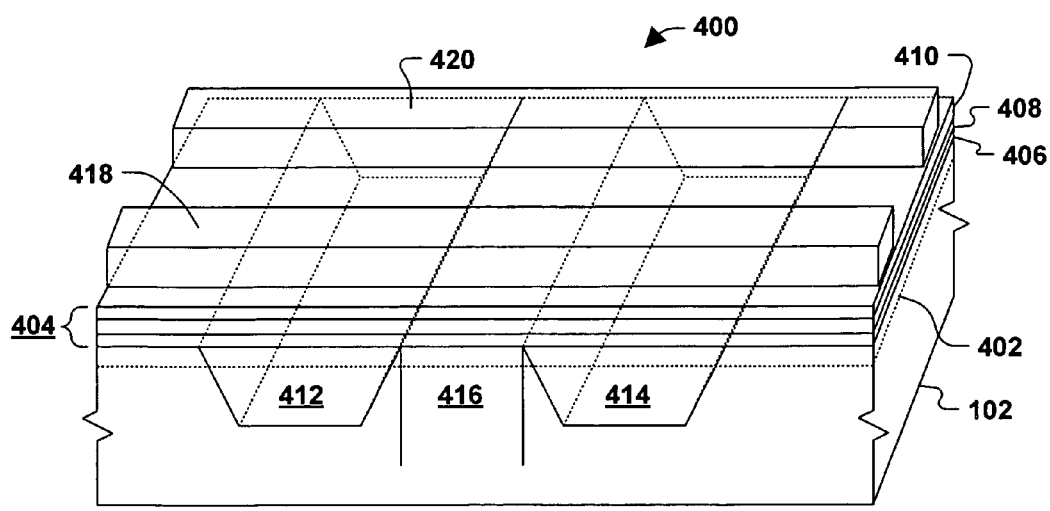
FIG. 4 is a cross-sectional isometric illustration of a portion of a dual bit flash memory, such as that taken along line 4—4 of FIG. 3 in accordance with an aspect of the present invention.

FIG. 4 is a cross-sectional isometric illustration of a portion 400 of a dual bit flash memory, such as that taken along line 4—4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 420 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Figure 5A:
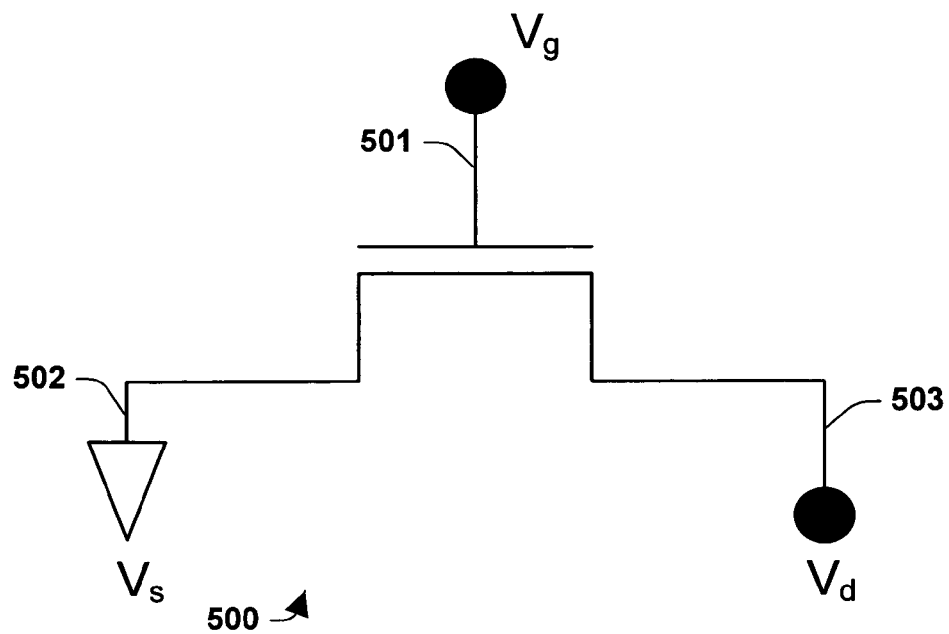
FIG. 5A is a schematic diagram of a dual bit memory cell during programming of the first bit in accordance with an aspect of the present invention.
Figure 5B:
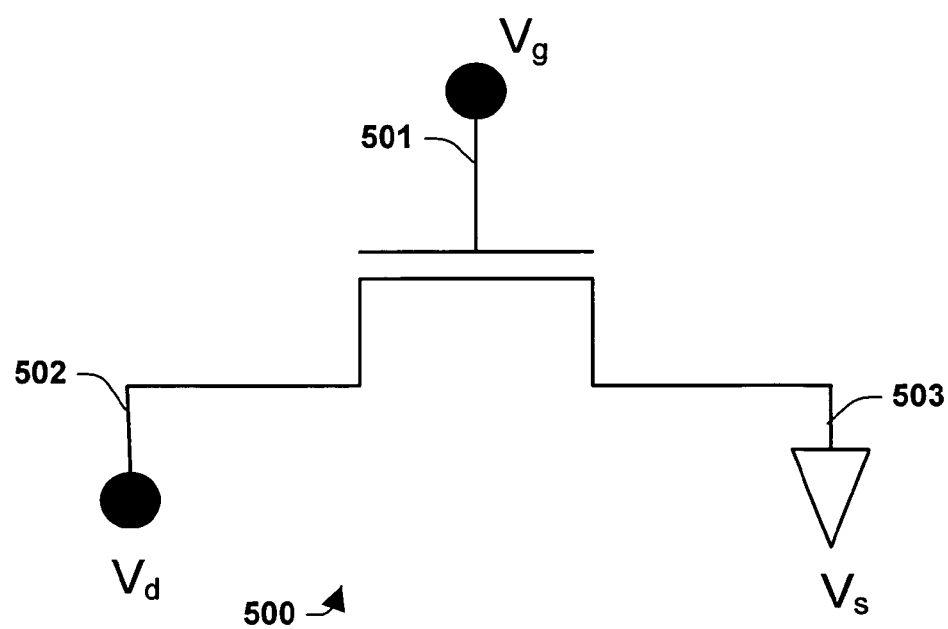
FIG. 5B is a schematic diagram of a dual bit memory cell during programming of a second bit in accordance with an aspect of the present invention.

FIGS. 5A and 5B, described below, illustrate programming of a dual bit memory cell in accordance with the present invention. The dual bit memory cell is operable to store a first bit and a second bit and allows programming and reading of each bit, individually. Typically, erasing is performed on an array or sector as a blanket operation that erases all cells within the array.

FIG. 5A is a schematic diagram of the dual bit memory cell 500 during programming of the first bit in accordance with an aspect of the present invention. The memory cell 500 includes a gate 501, a first active region 502, and a second active region 503. The first active region 502 and the second active region 503 operate as acting source or drain, depending on which bit is being programmed or read. To program the first bit, the first active region 502 is an acting source and the second active region is an acting drain.

Nominal programming values are associated with the memory device or array of which the memory cell 500 is a part. The nominal values include a program gate voltage, a program source voltage, and a program drain voltage. Typically, the program source voltage is ground, but may differ. Additionally, the memory cell 500 is a member of a group of one or more memory cells that have associated programming voltage adjustments for one or more of the gate 501, the acting source, and the acting drain. As a result, adjustment values including one or more of a gate adjustment value, a drain adjustment value, and a source adjustment value are present. These values can be zero, positive, and/or negative. Prior testing and characterizing of the memory cell 500 and/or other cells has established these adjustment values.

The memory cell 500 is programmed by applying the program gate voltage and a gate adjustment value to the gate 501, applying the program source and a source adjustment value to the acting source 502, and applying the program drain and a drain adjustment value to the acting drain 503. As a result, the programming operation is performed with relatively more properly than without the adjustment values. The adjustment values can compensate for conditions such as path resistance that alter applied voltages seen by the memory cell 500.

FIG. 5B is a schematic diagram of the dual bit memory cell 500 during programming of the second bit in accordance with an aspect of the present invention. The memory cell 500 includes a gate 501, a first active region 502, and a second active region 503. The first active region 502 and the second active region 503 operate as acting source or drain, depending on which bit is being programmed or read. To program the second bit, the first active region 502 is an acting drain and the second active region is an acting source.

Nominal programming values are associated with the memory device or array of which the memory cell 500 is a part. The nominal values include a program gate voltage, a program source voltage, and a program drain voltage. Typically, the program source voltage is ground. Additionally, the memory cell 500 is a member of a group of one or more memory cells that have associated programming voltage adjustments for one or more of the gate 501, the acting source, and the acting drain. As a result, adjustment values including one or more of a gate adjustment value, a drain adjustment value, and a source adjustment value are present. These adjustment values can be zero, positive, and/or negative. Prior testing and characterizing of the memory cell 500 and/or other cells has established these adjustment values.

The memory cell 500 is programmed by applying the program gate voltage and a gate adjustment value to the gate 501, applying the program source and a source adjustment value to the acting source 503, and applying the program drain and a drain adjustment value to the acting drain 502. As a result, the programming operation is performed with relatively more properly than without the adjustment values. The adjustment values can compensate for conditions such as path resistance that alter applied voltages seen by the memory cell 500.

Figure 6:
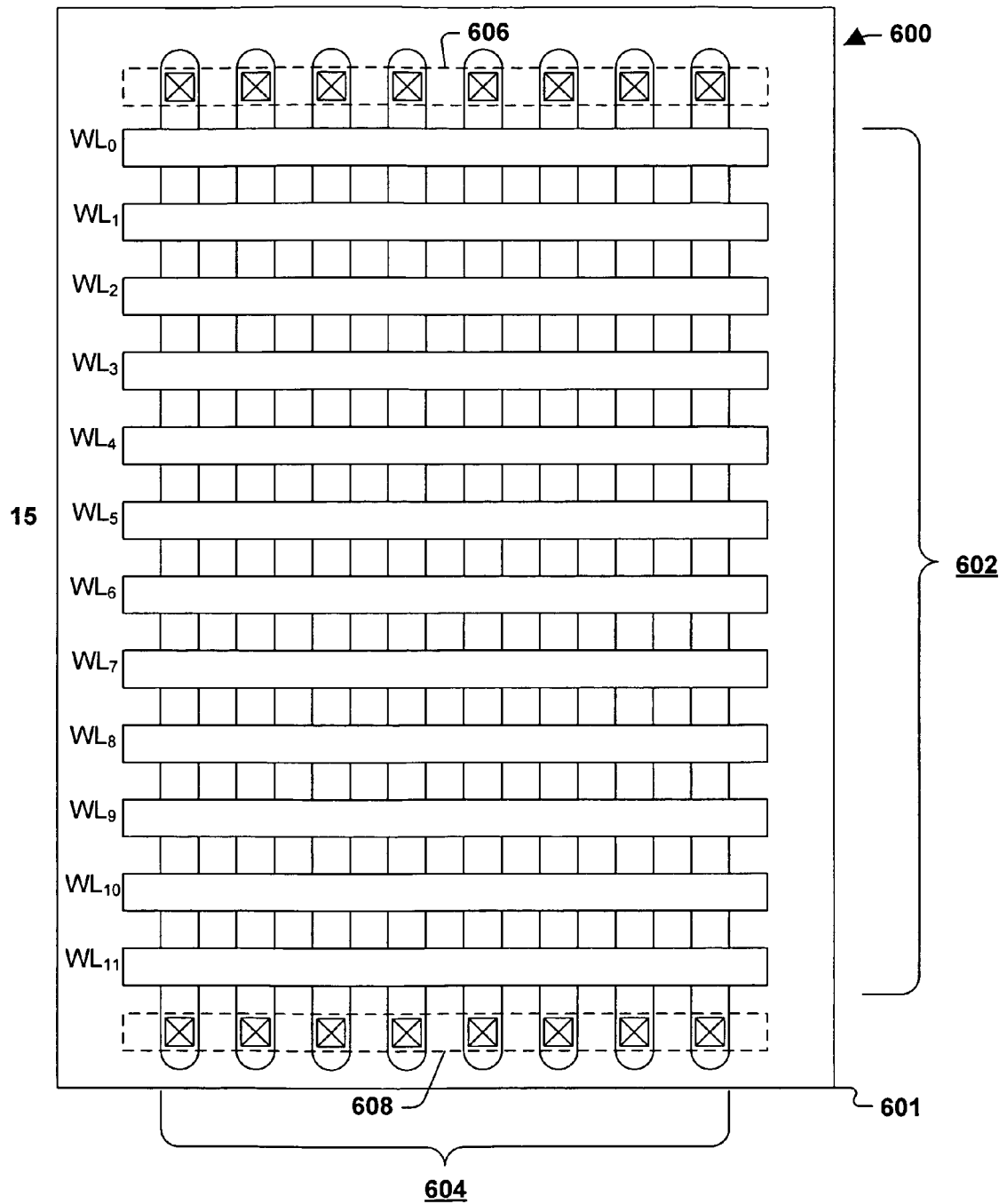
FIG. 6 is a top view illustrating at least a portion of a memory core/device, such as may include at least part of one of the M by N array cores depicted in FIG. 1 in accordance with an aspect of the present invention.

FIG. 6 is a top view illustrating at least a portion 600 of a memory core/device, such as may include at least part of one of the M by N array cores 104 depicted in FIG. 1 in accordance with an aspect of the present invention. This view is exemplary in nature and is provided to illustrate grouping of memory cells that have similar programming characteristics in accordance with the present invention. The memory portion 600 is formed upon a semiconductor substrate 601 and has a plurality of implanted bitlines 604 extending substantially parallel to one another, and further includes a plurality of formed wordlines 602 extending substantially in parallel to one another and at substantially right angles to the plurality of implanted bitlines 604. The view includes a first bitline contact 606 and a second bitline contact 608. It will be appreciated that the wordlines 302 and bitlines 304 have other contacts and interconnections (not shown) to programming circuitry such as may be represented, at least in part, by the x-decoders 108 and y-decoders 110 depicted in FIG. 1.

Flash memory devices are typically fabricated with bitline contacts for a given bitline that are repeatably present every so many memory cells. Bitline contacts could be formed for every memory cell in a memory device, but doing so would lead to an excessive amount of area consumption. Alternatively, a single contact could be employed per bitline, however path resistance present in bitlines would result in substantial variations in applied voltages for memory cells along the bitlines due to resistance from the contact to the memory cell. This contact to memory cell resistance reduces voltages seen at the memory cells from that applied to the contact.

The present invention employs placing bitline contacts along bitlines at selected intervals thereby mitigating contact to memory cell resistance and mitigating area usage. For example, FIG. 6 shows an interval of 12 wordlines, however other suitable intervals including 8, 16, and the like, can be employed in accordance with the present invention.

Basic diffraction pattern physics used in the manufacturing of integrated circuits suggest that memory cells close to an edge of a sector and/or contact behave differently than those further away. This tends to be a repeating pattern within a group of transistors (e.g., array, sector, and the like). As a result, a group of memory cells can be segmented into groups or subgroups of memory cells that have similar programming and/or operational properties. Programming variations can then be determined for the groups of memory cells that have similar programming properties and employed during programming to more efficiently and accurately program the memory cells.

Referring again to FIG. 6, there are 12 wordlines ($WL_0$ to $WL_{11}$) 602 within the memory portion 600 of the memory device. Memory cells at the wordlines $WL_0$ to $WL_{11}$ are at the first and second bitline contacts (606 and 608). Through characterization and/or analysis, the memory cells of the memory portion 600 can be grouped into groups having similar programming properties. One suitable, exemplary grouping/subgrouping is a first group of memory cells of $WL_0$ and $WL_{11}$, a second group of memory cells of $WL_1$ and $WL_{10}$, a third group of memory cells of $WL_2$ and $WL_9$, a fourth group of memory cells of $WL_3$ and $WL_8$, a fifth group of memory cells of $WL_4$ and $WL_7$, and a sixth group of memory cells of $WL_5$ and $WL_6$. The above groups have the trait of being at substantially similar distances from the first contact 606 or the second contact 608.

Because the present invention provides for adjusted programming values for different memory cells and/or groups of memory cells, memory devices can be supported having relatively larger intervals for bitline contacts than memory devices that do not provide for adjusted programming values.

Figure 7:
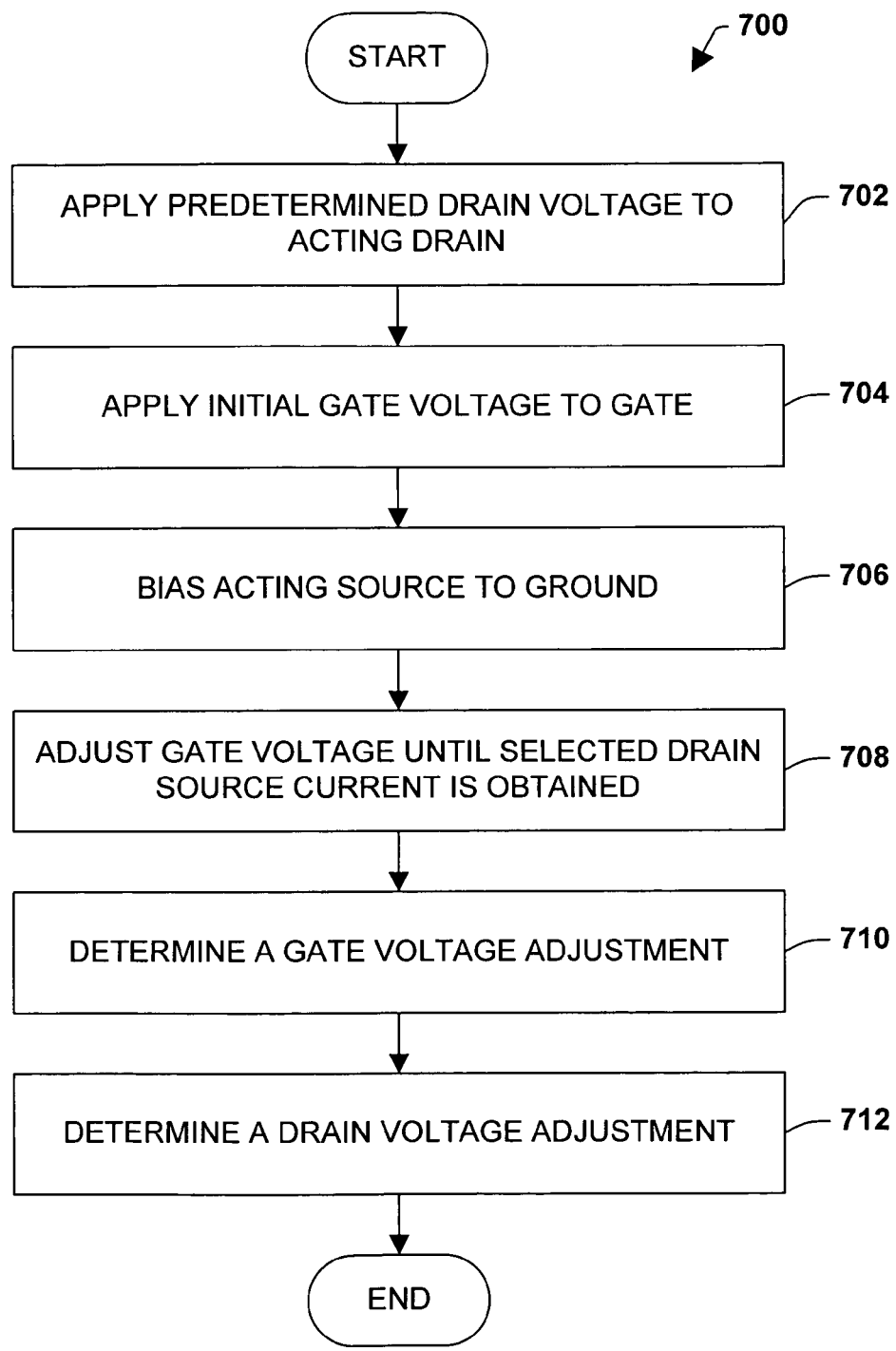
FIG. 7 is a flow diagram illustrating a method of characterizing programming properties of a dual bit memory cell in accordance with an aspect of the present invention.
Figure 8:
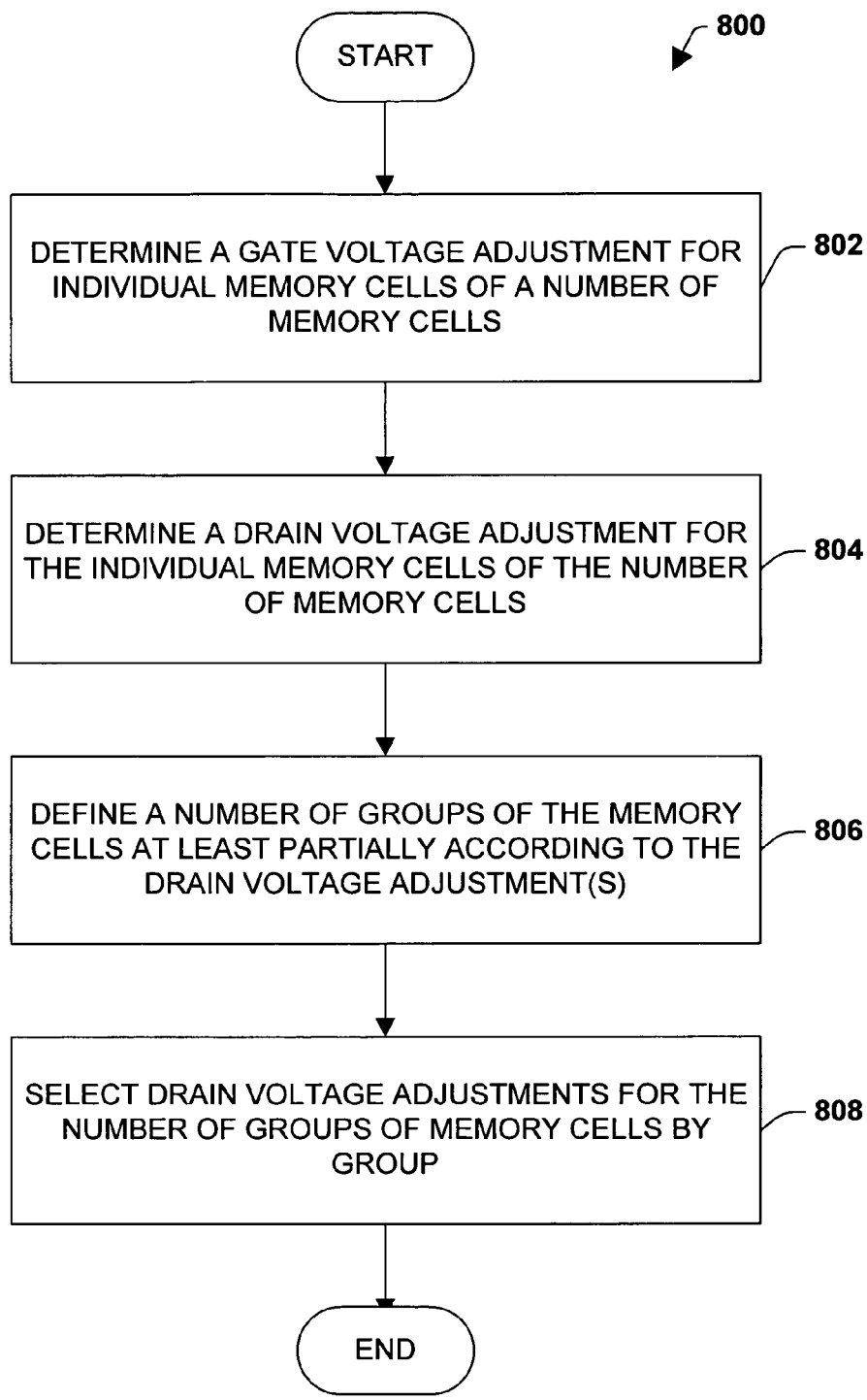
FIG. 8 is a flow diagram illustrating a method of determining drain voltage adjustments for groups of similarly characterized memory cells in accordance with an aspect of the present invention.
Figure 9:
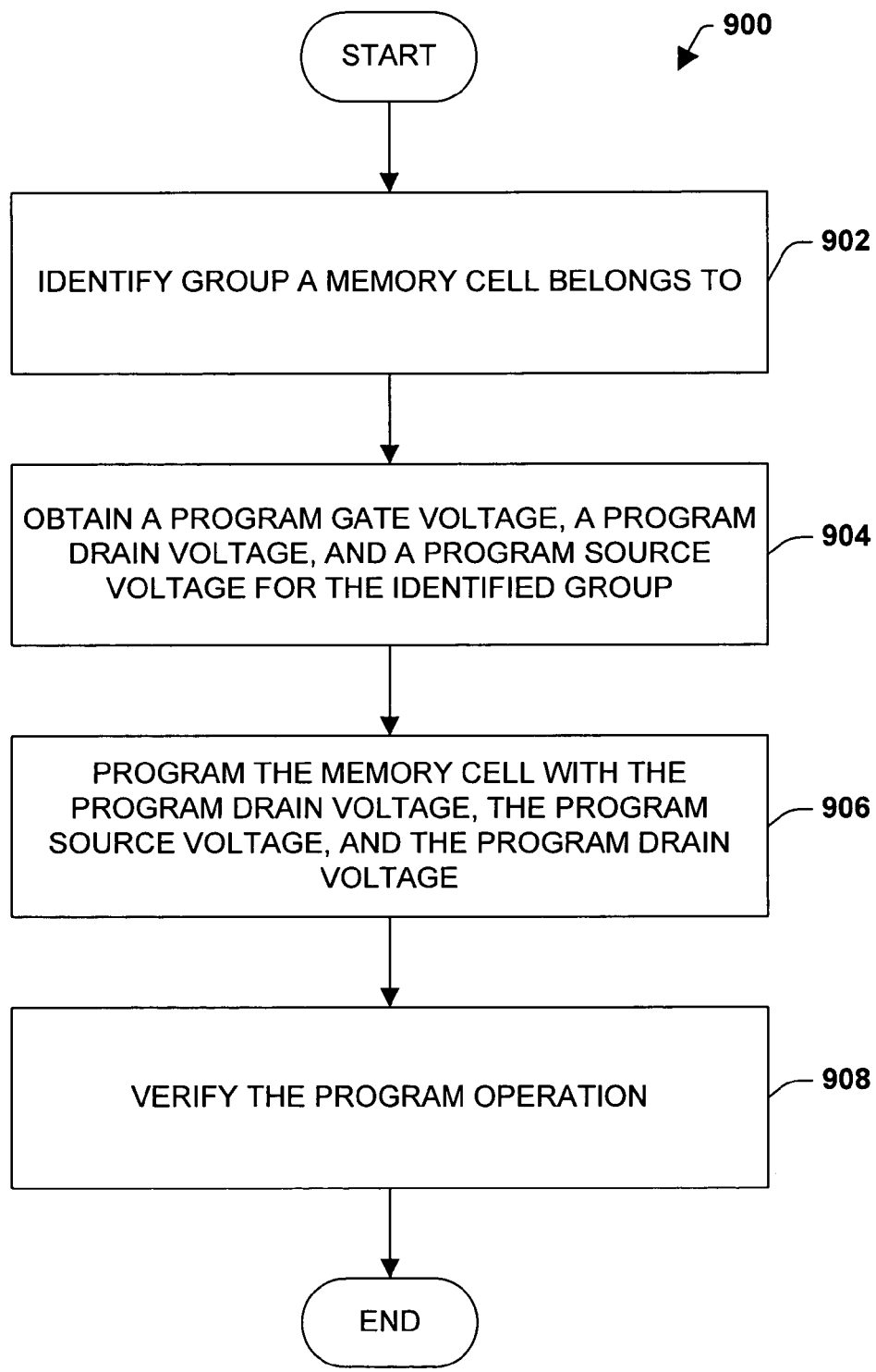
FIG. 9 is a flow diagram illustrating a method of programming a memory cell in accordance with an aspect of the present invention.

In view of the foregoing structural and functional features described supra, methodologies in accordance with various aspects of the present invention will be better appreciated with reference to FIGS. 1 to 6. While, for purposes of simplicity of explanation, the methodologies of FIGS. 7, 8, and 9 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 7 is a flow diagram illustrating a method 700 of characterizing programming properties of a dual bit memory cell in accordance with an aspect of the present invention. The method 700 operates on a first bit of a memory cell and applies a variety of voltages to the memory cell in order to determine programming adjustments specific to the memory cell.

The method 700 begins at block 702 wherein a predetermined drain voltage is applied to an acting drain of the memory cell. The acting drain is an active region or bitline associated with the first bit of the memory cell. A gate voltage is applied to a gate of the memory cell at block 704. The initial gate voltage is a positive value, such as, for example, about 9 volts. An acting source associated with the first bit of the memory cell is biased to about ground or a voltage of about zero at block 706.

Continuing at block 708, drain source current is measured and the gate voltage is adjusted (e.g., incremented or decremented) according to the measured drain source current until the measured drain source current is at an acceptable value. The adjusted gate voltage that obtained the acceptable measured drain source current, referred to as a measured gate voltage, and the initial gate voltage are compared to determine a gate voltage adjustment at block 710. The acceptable measured drain source current can vary from technology to technology, but should generally be at or about an expected programming current per bit, address, word, page, pages, sector, or the like depending on how the programming current is defined. The gate voltage adjustment can be positive or negative, such as, for example, +/−0.1 volts.

The device physics of flash memory devices, especially as dimensions become smaller and smaller, suggest that a measured programming adjustment is substantially due to the biasing of the acting source being at a non zero level. As a result, an amount of compensation for a program drain voltage is about on the same order as the gate voltage adjustment determined above. Accordingly, a drain voltage adjustment value for programming is determined at block 712. The drain voltage adjustment value is on the same order of magnitude as the gate voltage adjustment, but is not necessarily equal to the gate voltage adjustment. The gate voltage adjustment is typically a function of where a sector is laid out on a device, wherein sectors further away from an origin of a gate voltage supply require larger adjustments and sectors closer to the origin of the gate voltage supply require smaller adjustments. The drain voltage adjustment is generally a function of wordline symmetry, wherein groups or sets of memory cells farther away from bitline contacts typically, but not always, require greater adjustment due to a more resistive path. The drain voltage adjustment can be determined by characterizing the memory cell (e.g., via a test chip or test product vehicle) and analyzing resulting data.

FIG. 8 is a flow diagram illustrating a method 800 of determining drain voltage adjustments for groups of similarly characterized memory cells in accordance with an aspect of the present invention. The method 800 operates on memory cells within an array or device in order to characterize and group memory cells with similar programming characteristics. Then, the method 800 selects programming characteristics for the created groups.

The method 800 begins at block 802 where gate voltage adjustments for at least a portion of memory cells of a memory device. The memory device can be an entire core area, an array, one or more sectors, and the like. The method 700 of FIG. 7 above can be employed to obtain the gate voltage adjustments. The portion or memory cells characterized are selected to simulate similarly situated memory cells within the device, thereby avoiding determining gate voltage adjustments for all the memory cells of a device. However, it is appreciated that the present invention includes determining gate voltage adjustments for all or some of the memory cells of a particular memory device. Alternately, the gate voltage adjustments can be determined as a function of location or distance from a gate voltage supply instead of the method 700 of FIG. 7.

The method 800 continues at block 804 wherein drain voltage adjustments are determined for the portion of memory cells. As stated above, the device physics of flash memory devices suggest that a measured programming adjustment is substantially due to the biasing of the acting source being at a non zero level. An amount of compensation for a program drain voltage is about on the same order as the gate voltage adjustment determined above. The drain voltage adjustment is generally a function of wordline symmetry, wherein groups or sets of memory cells farther away from bitline contacts typically, but not always, require greater adjustment due to a more resistive path. The drain voltage adjustment can be determined by characterizing the memory cell (e.g., via a test chip or test product vehicle) and analyzing resulting data. Some examples of suitable drain voltage adjustments and gate voltage adjustments include −0.5 to +0.5, −1.0 to +0.5, and the like. However, the present invention is not limited to a specific range of drain and/or gate voltage adjustments, which can vary according to characteristics of various memory devices, and includes other suitable ranges of drain and/or gate voltage adjustments.

Memory cells of the device are segmented or defined into a number of groups of memory cells at block 806, wherein the groups have similar properties including, but not limited to, similar drain voltage adjustments, similar distance to contacts, similar distance to power source, and the like. FIG. 6, described above, illustrates an exemplary grouping of memory cells in accordance with the present invention. Thus, grouping can be based on determined or expected drain voltage adjustments, a range of distances from contacts, sector location, and/or combinations thereof.

Subsequently, drain voltage adjustments are selected for the number of groups at block 808. Additionally, gate and/or source voltage adjustments can also be selected for the number of groups. The group drain voltage adjustments are selected such that the adjustment permits programming of all the memory cells within the respective group. One suitable mechanism for selecting a drain voltage adjustment for a given group is to derive an average drain voltage adjustment for memory cells of the group.

It is appreciated that alternate aspects of the invention include deriving adjustments for groups in addition to or instead of drain voltage adjustments based on source voltage adjustments and/or gate voltage adjustments.

FIG. 9 is a flow diagram illustrating a method 900 of programming a memory cell in accordance with an aspect of the present invention. The method 900 is operable to program a bit of the memory cell and employs programming voltages tailored for the memory cell in order to improve programming of the cell.

The method 900 begins at block 902 where a group is identified that a memory cell belongs to. The group is a group of one or more memory cells that have similar or substantially similar programming characteristics including, but not limited to, program gate voltage, program drain voltage, program source voltage. The identified group is one of a number of groups of memory cells for a memory device or memory array.

Program voltages, including a program gate voltage, a program drain voltage, and a program source voltage, associated with the identified group are obtained at block 904. The program voltages are based on nominal values for the entire device or array and an adjustment value specific to the group of which the memory cell is a member. One or more of the voltages can vary from the nominal values. Characterization and grouping operations are performed previously to identify the adjustments and appropriately group the memory sells. FIGS. 7 and 8 illustrate suitable characterization and grouping operations in accordance with the present invention.

The memory cell is then programmed at block 906 with the program drain voltage, the program source voltage, and the program drain voltage obtained for the identified group. The program drain voltage is applied to an acting drain of the memory cell, the program source voltage, typically ground, is applied to an acting source of the memory cell, and the program gate voltage is applied to the gate of the memory cell. Subsequently, the program operation is verified at block 908 to ensure that the memory cell is indeed programmed. If the verification fails, the memory cell can be reprogrammed again until a successful verification.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of characterizing programming properties of a dual bit flash memory cell comprising:

applying a drain voltage to an acting drain of the memory cell and applying a source voltage to an acting source of the memory cell;

concurrently applying a gate voltage to a gate of the memory cell, wherein the gate voltage is at an initial value;

measuring a drain source current from the acting drain to the acting source and repeatedly adjusting the applied gate voltage according to the measured drain current until the measured drain current is about an acceptable value;

determining a gate voltage adjustment for the memory cell according to a final value of the applied gate voltage and the initial value;

determining a drain voltage adjustment for the memory cell.

2. The method of claim 1, wherein applying the source voltage to the acting source comprises biasing the source to a voltage value selected from a range comprising −0.5 volts to +0.5 volts.

3. The method of claim 1, wherein adjusting the applied gate voltage comprises increasing the applied gate voltage by a step value.

4. The method of claim 1, wherein adjusting the applied gate voltage comprises decreasing the applied gate voltage by a step value.

5. The method of claim 1, wherein the initial value is about 10 volts.

6. The method of claim 1, wherein the drain voltage is determined according to distance from bitline contacts.

7. The method of claim 1, wherein determining the drain voltage adjustment comprises setting the drain voltage adjustment to equal the gate voltage adjustment.

8. The method of claim 1, further comprising programming the memory cell by applying the a gate voltage having the initial value to the gate of the memory cell, by connecting the acting source of the memory cell to ground, and applying the drain voltage and the drain voltage adjustment to the acting drain of the memory cell.

9. The method of claim 1, further comprising:
   determining drain voltage adjustments for additional memory cells within a memory device;
   segmenting the memory cell and the additional memory cells of the device into a number of groups according to programming properties, wherein the programming properties include the determined drain voltage adjustments; and
   selecting group drain voltage adjustments for the number of groups that allow programming of memory cells within the groups.

10. The method of claim 9, wherein segmenting the memory cell and the additional memory cells according to programming properties includes segmenting according to distances from bitline contacts.

11. The method of claim 9, wherein segmenting the memory cell and the additional memory cells of the device according to programming properties includes segmenting according to distance from a power source.

12. The method of claim 9, wherein selecting group drain voltage adjustments comprises determining an average drain voltage adjustment for memory cells within respective groups.

* * * * *